(12) United States Patent
Witmer

(10) Patent No.: US 6,292,127 B1
(45) Date of Patent: Sep. 18, 2001

(54) MULTIPLE STATE ELECTRONIC DEVICE

(76) Inventor: Warner Harry Witmer, 306 Vista Dr., Phoenixville, PA (US) 19460

( * ) Notice: Subject to any disclaimer, the term of this patent is extended or adjusted under 35 U.S.C. 154(b) by 0 days.

(21) Appl. No.: 09/496,968

(22) Filed: Feb. 2, 2000

(51) Int. Cl.[7] ..................................... H03M 1/00
(52) U.S. Cl. .......................... 341/172; 341/150
(58) Field of Search ..................... 341/172, 150

(56) References Cited

U.S. PATENT DOCUMENTS

| | | | | |
|---|---|---|---|---|
| 4,032,948 | * | 6/1977 | Engeler et al. | 257/243 |
| 4,471,341 | * | 9/1984 | Sauer | 341/172 |
| 4,716,580 | * | 12/1987 | Berger | 341/172 |

* cited by examiner

Primary Examiner—Howard L. Williams

(57) ABSTRACT

This invention relates to semiconductor apparatus capable of multiple stable electronic states allowing higher order mathematical radix analysis of analog and digital signals. The device accomplishes direct A/D signal conversion with increased circuit speed while decreasing electronic component density compared to computational circuits based on binary conversion. In particular the invention relates to semiconductor apparatus and devices for analog-to-digital conversion and waveform differentiation or integration of electronic signals by use of higher order number systems. In addition the invention relates to novel construction of charge-coupled devices finding applications especially with respect to detection and manipulation of electronic signals for A/D conversion, mathematical differentiation, integration, and encryption of electronic waveform signals.

6 Claims, 5 Drawing Sheets

MULTIPLE STATE ELECTRONIC DEVICE

BACKGROUND OF THE INVENTION

1. Field of the Invention

This invention relates to semiconductor apparatus capable of multiple stable electronic states allowing higher order mathematical radix analysis of analog and digital signals. In particular the invention relates to semiconductor apparatus and devices for analog-to-digital conversion and waveform differentiation or integration of electronic signals by use of higher order number systems. The invention discloses construction of semiconductor charge coupled devices for accomplishing the same. In addition the invention relates to novel construction of charge-coupled devices finding applications in electronics, especially with respect to detection and manipulation of electronic signals for A/D conversion, mathematical differentiation, and integration of electronic waveform signals. The device accomplishes direct A/D signal conversion with increased circuit speed while decreasing electronic component density compared to computational circuits based on binary conversion.

2. Description of the Prior Art

In telecommunications and computer processing, digital signals are generally in the form of binary numbers because of two main reasons. First, conventional electronic switching components are in one of two states, namely 'OFF' or 'ON'. An electronic switch turned ON corresponds to the digit '1' and the same switch turned OFF corresponds to the digit '0'. From an electronic device standpoint the two electronic states, ON/OFF, has been easier to achieve than finding an electronic component that exhibits multiple stable states. Especially it has been found extremely difficult to find electronic components having incremental multiple stable states. The second reason digital circuits are designed with binary numbers is because of signal transmission reliability. Because of noise in signal transmission lines it has been found easier to recognize a '0' and a '1' among random electronic transmission noise than to identify multiple signal strengths among all this noise. This Von Neumann architecture has certainly well served Americas vast computing and digital transmission requirements to this point.

In U.S. Pat. No. 3,958,210, issued to P. A. Levine on May 18, 1976, an electronic system for analog-to-digital conversion was disclosed including a semiconductor charge coupled device, utilizing the properties of semiconductor surface potential wells for charge storage and transfer in response to voltages applied to electrodes overlying the wells. However, the semiconductor charge coupled device portion of that system produced only a digital counting representation (unitary based number system) of the input analog signal, and the system required complex logic circuitry to convert this digital counting representation into the ultimately desired representation in the binary number system. In other words, an analog input representing the number n was converted by the charge coupled device portion into a "unitary" sequence purely of n "ones" (1,1,1, . . . 1,1,1)according to the unitary number system, rather than directly into the desired binary sequence of "ones" and "zeros" according to the binary number system. Complex logic circuitry was thus required for subsequent conversion of the "unitary" sequence into a corresponding binary digital sequence such as (1,0,1 . . . 0,1, 1) representing n=I×21 . . . +0×2i–I+1×2i–2+ . . . +0×2,4+I×21I×20, where i is selected such that I×V is the "most significant bit" in the number n.

Need for Higher Radix System

There are a number of reasons to consider a higher order number radix than binary for computing and telecommunication architecture. First of all, analog and digital integrated circuit manufacturing complexity seems to be approaching an optical resolution limit whereby it is becoming difficult to increase the number of gates on a chip. Second, fiber optic transmission lines have greatly allowed cleanup of noise in transmission systems. A major consideration is that while the electronic world is mostly digital the real world is almost entirely analog. And, of course, if the computer world works in binary arithmetic the real world is conventionally a decimal world. The technical disadvantages of binary-based integrated circuit technology are (1) maximum MOST gate complexity of any number system, (2) slowest speed of any radix system, and (3) decreased manufacturing yield because of the huge number of MOSTs required for number representation. It would be extremely desirable to have available an electronic device of more than two stable electronic states because the number of digits, or 'gates' required in a computer chip for number representation is a consequence of the mathematical number radix. A higher order digital number radix than binary, as a consequence of requiring far fewer 'gates' for number representation, allows much increased circuit speed. This is a consequence of inherent signal delay times, each gate. Decreasing the number of gates would allow much increased circuit speed. Consequent decreased circuit density allows increased manufacturing yield for a given function representation.

Pressures, temperatures, speeds, fluid flows, etc. all change continuously. To deal with this real world analog information typically an electronic circuit converts the signal information from analog to binary digital, then sends the digitized information over a signal transmission system, and then reconverts the binary digital form back to analog. One or more chips are used for analog-to-digital conversion, one or more chips for binary signal transmission, one or more for program storage, one or more for scratch pad read/write, and one or more chips are required for input/output lines, until finally the signal is reconverted from digital-to-analog. These conversion processes require many extremely complicated electronic integrated circuits whereby the total binary conversion times, plus delay due to the huge number of binary switching components results in considerable reduction of circuit speed. Moreover, even faster speeds are required of the Internet, especially for video signal transmission and compression, requiring much faster D-to-A and A-to-D conversion times. Faster electronic circuits for such wave signal processes as integration, differentiation, and multiplexing are desired. A number system analysis shows why a radix higher than binary is desirable.

Number System Considerations

Every positive integer 'a' can be expressed in the base system form, $$a = r_m b^m + r_{m-1} b^{m-1} + \ldots + r_1 b + r_0,$$

where m is a nonnegative integer and the r's are integers such that, $$0 \leq r_m, b \text{ and } 0 \leq r_i < b \text{ for } i=0,1,\ldots,m-1.$$

Base number b can be ally positive integer b>1. The number of terms, or digits, in the series representing a numeral decreases greatly as b increases. Comparing, for example, the decimal system to the binary system, the number of digits in the decimal system increase as, $$\ldots + r_2(100) + r_1(10) + r_0(1),$$

compared to the binary equivalent, $$\ldots +r_2(1100100)+r_1(1010)+r_0(1),$$

where the integers $r_1$, $r$, $r_3$, ... $r_n$ must be converted to the binary system and multiplied. Similarly, decimal numbers less than 1 requires an increasing number of terms as the base integer decreases.

Increasing the radix of the number system sharply decreases the number of 'gates' that must physically be formed on integrated circuit chips required for numeric expression. For example, the binary equivalent of the decimal number 1,000 is the unwieldy 1111101000, requiring 250% more 'gates' to allow expression of the decimal equivalent. The binary number 100101101001 require 300% more gates than its decimal equivalent 2409. As number representations become much larger the gate equivalents become huge. Programmers try to alleviate the burden of working with binary 'machine code' directly by resorting to binary shorthand codes like Octal and Hexadecimal, then converting back to binary.

This analysis of higher order number systems, showing radix higher than binary, predicts that a multi-state electronic device holds considerable applicability to meeting the goal of high performance, low power consumption, high circuit density, high manufacturing yield compared with conventional binary technologies.

Charge Transfer Devices

Charge-coupled devices (CCDS, or CTDS) are semiconductor systems in which charge packets are stored in potential wells created at the surface or within the bulk of a semiconductor and in which these charges are transferred by displacing the potential wells. The charges displaced in devices of the Surface CCD (SCCD) type are minority carriers of the semiconductor substrate, for example electrons if the semiconductor is of the p-type, or majority carriers in Bulk CCD (BCCD) devices. For background information on the general properties of these charge-coupled devices, reference can be made to the two original articles published on this subject in the "Bell System Technical Journal", volume 49. 1970 and entitled respectively "Charge-coupled semi-conductor devices" by W. S. Boyle and G. E. Smith (page 587) and "Experimental verification of the charge-coupled device concept" by G. F. Amelio, M. F. Tompsett and J. E. Smith (page 5933).

This charge transfer mechanism is accomplished by application of variable voltage to neighboring capacitors making it possible to transfer the charge packet because the charges accumulate where the voltage well is the deepest. This mechanism of adjoining MOS capacitors arranged to allow electronic charge transfer comprises, in very broad outline, a doped semiconductor substrate, a layer of insulating material, and an array of metallic electrodes which are brought to suitable potentials. The MOS electrodes are systematically arranged so that charge-packets can be transferred along the CCD register. Conventionally, SCCDs sequentially transfer the charge packet of minority carriers along a series of transfer electrodes in step with a square wavepulse of uniform amplitude.

A group of electrodes with a common electric link is called a phase. The command signals applied to the MOS electrodes are sequential and are called clocks. Each phase is driven by a distinct clock signal. All the clocks together form a clock timing sequence which must be carefully adjusted (to optimize elements such as the speed, the number of clock signals to be sent to the CCD, the relative phasing of the clocks, etc.) for each type of CCD. There are numerous transfer methods, specific for a given type of CCD, and they generally differ by the number of phases involved.

In the first charge-coupled devices, each of three clocks were connected by control lines to one electrode out of three. These were followed by a design of CCD having only two control lines in which asymmetrical potential wells are created beneath the electrodes. By way of example, reference can be made to U.S. Pat. No. 1,829.884 filed Jan. 13, 1972. and to the article by W. F. Kosonockv and J. E. Carmes published in the IEEE Journal of the Solid State Circuit, volume 6, No. 5, October, 1971 and entitled "Charge-coupled digital circuit". In these devices, the asymmetrical potential created beneath the electrodes is obtained either by means of surface region which is more heavily doped beneath the upstream edge of the electrode than beneath the remainder of the electrode or by means of different thickness of oxide from one edge of the electrode to the other. Charge-coupled devices have also been proposed in which only one control line is connected to all the electrodes. 1Ø, 2Ø, and 4Ø state-of-the-art CCDs are alternative to the 3Ø type described herein as illustrative of one embodiment of the present invention.

Depletion Well Control

The essential construction of the CCD is an array of closely spaced side-by-side MOS capacitors. By sequential application of electrode voltage, transfer of the minority carrier charge packet to succeeding electrodes is accomplished by the technology of depletion layers overlap. Thus formation of sequential overlapping depletion layers allows the charge packet to be stepped electrode to electrode.

The MOS structure is essentially an electrode very closely spaced from at semiconductor by a thin dielectric. For example, p-type silicon of about $10^{15}$ carrier density can be separated by a thin silicon dioxide layer about 0.1 $\mu$m thick from an overlying aluminum electrode about 1 $\mu$m thick. Application of increasing positive voltage to the electrode repels holes in the semiconductor under the electrode forming a depletion layer ranging from about 1–6 $\mu$m deep until sufficient voltage causes an inversion layer of minority carrier's (electrons) to form immediately under the electrode. This inversion charge consists of approximately one million electrons for the MOS device parameters listed. Depletion layer deepening into the semiconductor shows a linear relationship with applied voltage to the gate. The depletion layer also occurs laterally from the electrode to almost the same distance as within the depth of the semiconductor. The equation describing the depth of the depletion layer is described physically by the equation, $$\emptyset_s = V_G + V_0 + Q_{INV}/C_{OX} - [2(V_G + Q_{INV}/C_{OX})V_0 + (V_0)^2]^{1/2},$$

where $V_0$ is a constant given by $(qN_A \in_s) / (C_{OX})^2$, q is electronic charge, $N_A$ is acceptor atom doping level, $Q_{INV}$ is the inversion layer charge, $C_{OX}$ is the oxide capacitance, $V_G$ is the voltage applied to the gate, and $\in_s$ is the permittivity of silicon. A good approximation for $\emptyset_s$ is the linear expression, $$\emptyset_s = V_G + Q_{INV}/C_{OX}$$

because of the lightly doped substrates and thin oxides usually used for CCD structures. ($V_0$ is about 0.14, for a 0.1 $\mu$m oxide, for example, compared to many volts for $V_G$).

There are a number of state-of-the-art methods to fix the specific gate voltage, $V_G$, necessary to allow charge transfer from one electrode to the next. One method is to control the physical distance of MOS capacitor electrode A (i.e., the 'source') from electrode B (i.e., the 'drain'). A wider spacing requires higher electrode voltage to allow the depletion layer to spread to the next adjacent electrode and thereby allow transfer of the inversion charge packet. Gate dielectric thickness control is another. Another way is by means of ion implantation.

Ion Implantation

One particularly useful way to control the electrode voltage necessary for charge transfer is by ion implantation, an IC process now well established. This is usually accomplished by either controlling charge in the gate dielectric or by implantation of ions in the semiconductor immediately between the electrodes. This control of dopant density in the semiconductor between the 'source' and 'drain' is the preferred way to accomplish stable threshold control because semiconductor dopant density can be set very exactly by use of ion implantation.

Ion implantation is an IC process now so well controlled that it is widely used in the microelectronics industry to achieve precise desired threshold voltage in CMOS devices, for channel stop implantation, source/drain formation, graded source and drains, and in particular for precision control of charge well formation. Ion implantation is a physical process not a chemical process like diffusion. The process takes place at room temperature and there is no side diffusion due to high temperature processing. Consequently, there is greater control of doping concentrations. The following are the important advantages of ion implantation: (a) precise control of implanted dopant atoms into photolithographically defined areas of a substrate to within 1.5% for dopant control in the $10^{14}$ to $10^{18}$ atoms/cm$^3$ range, (b) less lateral distribution of implanted impurities compared to diffusion processes (thus allowing smaller feature dimensions). (c) dopant injection through thin oxide layers allowing precision control of MOS threshold voltage while the SiO acts as a protective screen to other contaminants, (d) predicted ranges of implanted ions fits experimental data very well, high energy light ions within 2%, (e) highly abrupt junctions can be formed, (f) uniform doping across large wafers can be achieved, (g) photoresist can be used as a mask.

By the ion implantation process, energetic charged atoms or molecules of a particular species can be implanted in a semiconductor to the exact quantity required. By this method charge transfer threshold voltage can be closely controlled by adjustment of the substrate doping, P. under and/or between the required MOS transfer electrode. The equation describing this relationship is, $$V_G - V_{FB} = V_s + H/C_{OX}(2K_S e_0 q N_A V_S)^{1/2}$$

The dopant density N affects the surface potential, consequently the gate voltage required to produce inversion. Since dopant density at the surface of the semiconductor can very accurately be set in a MOS gate by ion implantation, consequently the voltage required to allow charge transfer in a CCD can be accurately set. Threshold voltage in NMOS gate transfer regions of a CCD device can be controlled, for example, by implanting a precise quantity of Boron atoms through the thin gate oxide of an NMOS CCD charge transfer region to adjust transfer voltage. $V_T$ changes by $$\Delta V_T = -\Delta Q_B / C_{OX}$$

where $\Delta Q_B$ is the change of the sheet ionized dopant charge in the channel, and $C_{OX}$ is the gate oxide capacitance per unit area. By selecting a suitable energy, the B atoms just penetrate the thin oxide (~200–500 Å) of the device regions, but not the thicker oxide (~7500 Å) of the field regions. The projected ranges of B in Si and SiO2 are about the same, making the correct selection of the implantation energy a relatively simple task.

Photoresist and thin metal layers can be used as doping barriers along with thin silicon dioxide layers. Localization of the charge can be controlled using photolithographic means whereby resist is left in areas where implant is not desired. In fact the implanted species can be controlled so as to be located at a particular desired depth in the semiconductor. Ion implantation technology holds the most promise for a reliable and reproducible multi-state electronic component, the subject of the invention herein.

BRIEF SUMMARY OF THE INVENTION

An overall objective of the present invention is to overcome problems inherent in binary based electronic devices.

An objective of the inventive device disclosed herein is to provide advanced circuitry architecture for A-to-D conversion with inherently faster response speed and direct applicability to waveform integration and differentiation.

A further goal of the invention is disclosure of applicability of the proposed circuit architecture with enhanced performance, power consumption, circuit density, and potential manufacturing yield compared with conventional binary architectures.

These and other objectives of the novel device are accomplished by a multistate electronic device, preferably fabricated by conventional IC technology, that can reliably replace the ON/OFF switching states now universally used in digital circuitry and to apply this circuitry architecture to the particular needs of Analog-to-Digital conversion. According to one aspect of the invention, there is provided a method for design of a multi-state device by use of a recurring charge coupled device of cycle time T whereby the CCD is designed as to require incremental increased pulse amplitude for charge transfer each CCD stage. Conventionally, charge coupled devices sequentially transfer charge packets along a series of transfer electrodes in step with a square wave impulse of uniform amplitude whereas a main feature of the new device is the requirement of incrementally and progressively increased pulse amplitude electrode-to-electrode for charge transfer resulting in a multi-state electronic device. Depending upon the amplitude of the applied, or "signaling" transfer voltage, the charge can be transferred to the corresponding voltage amplitude stage of the CCD and no further. Further pulses of the same amplitude cannot bring about further charge transfer and the charge packet 'rests' in the position corresponding to the signaling amplitude for a time period set by the recurring cycle time T. Corresponding to the 'rest' position of the charge at the end of the recurring time period T the charge in that location may be gated to a corresponding output diode or similar device. Thereby detection of the maximum voltage amplitude of the applied waveform can be identified during a sampling time T.

The combined parameters of waveform amplitude detection and the cycle time T allows additional usefulness including differentiation and integration of the waveform. The recurring cycle time period T. corresponding to charge step transfer time for a full cycle, or one revolution of the recurring CCD, allows immediate integration and differentiation using well-known successive approximations. As cycle time becomes faster, the output waveform approaches the waveform integral as a limit by summation of the output values. Similarly, differentiation of the analog waveform is accomplished by dividing the successive difference of output values by the differentiation time. Thereby the waveform output approaches the differentiation limit as cycle time becomes faster. Cycle time can be extremely fast in CCD devices.

Another object of the invention therefore is to disclose applicability of the chosen architecture to mathematical integration and differentiation circuitry anticipating higher circuitry speed for a given numerical expression.

A further object of the multistate electronic device is advanced circuitry architecture allowing faster response speed and decreased gate requirements with applicability to integrated data systems by furthering the goal of high performance, low power consumption, high circuit density, and high manufacturing yield compared with conventional binary technologies.

The desirable technical features of the multi-state device are the following (I) much decreased gate complexity for a given numerical expression, (2) high speed by reduced gate requirement, and (3) improved manufacturing yield by decreased gate density.

Integration and Differentiation of Waveforms

Since cycle time can be extremely fast in CCD devices, the incremental charge transfer device herein described allows reproducible A/D conversion plus mathematical integration and differentiation of analog waveforms. This is disclosed in the novel device by the electronic processes of waveform amplitude detection combined with interval timing to allow integration and differentiation of the waveform.

Because of highly controllable IC fabrication processes now available, i.e., high-resolution photolithography, ion implantation, advanced CC manufacturing methods plus the inherent decrease in gate density as a result of higher order number representation, the manufacturing yield of the multistate device should have considerable advantage over binary gate IC equivalents.

DETAILED DESCRIPTION OF THE INVENTION

Figure 1:
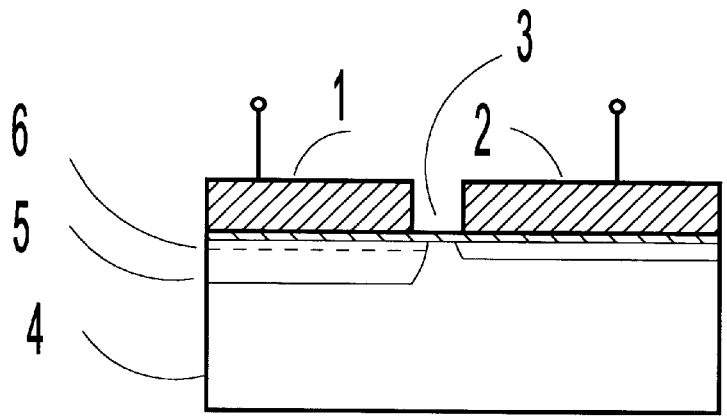
FIG. 1 shows increasing negative voltage applied to Electrode A, forming depletion layer spreading, adjacent to Electrode B on N-type semiconductor

Referring now to the drawings, FIG. 1 shows two closely spaced MOS capacitors consisting of electrodes 1 and 2 separated by the thin oxide layer 3 from a lightly doped p-type silicon semiconductor 4. Increasing positive voltage applied to electrode 1 repels majority carriers in the semiconductor 4 resulting in formation of a deepening inversion layer 5 in the semiconductor. Because of the physics of MOS devices the depletion layer depth is almost exactly matched by depletion layer spreading (i.e., widening) adjacent the electrode. This deepening or spreading varies in a linear fashion.

At sufficient positive voltage the minority carriers in the semiconductor (electrons in this case) are attracted to the silicon surface immediately under the electrode forming the charge packet 6. At sufficient positive voltage applied to both electrodes 1 and 2 the depletion layers may be made to connect. Thereby at reduction of the positive voltage applied to electrode 1 and sufficient positive voltage applied to electrode 2 the charge packet which was under electrode 1 can be transferred to electrode 2.

Figure 2:
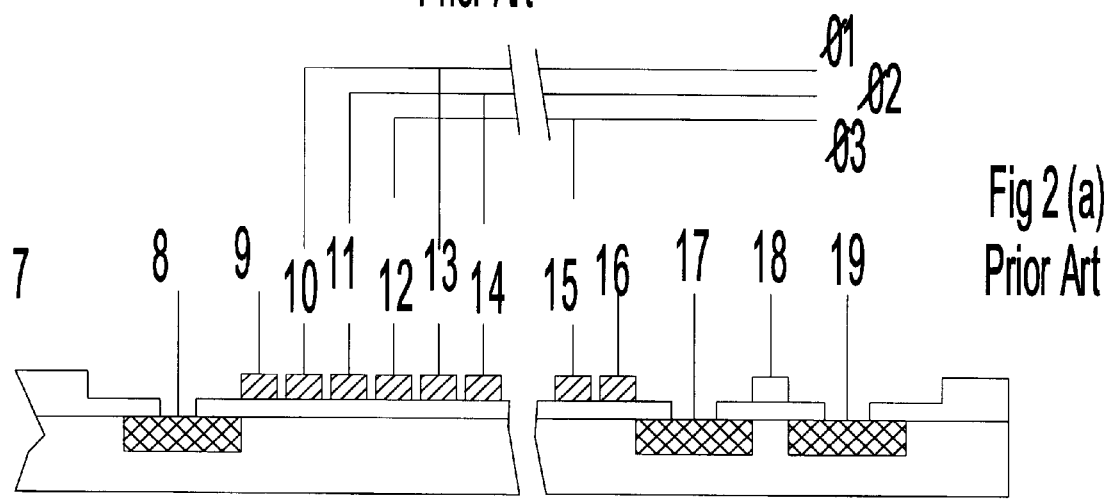
FIG. 2 illustrates the principle of three-phase transfer and the means for charge injection, output, and sensing.
Figure 2:
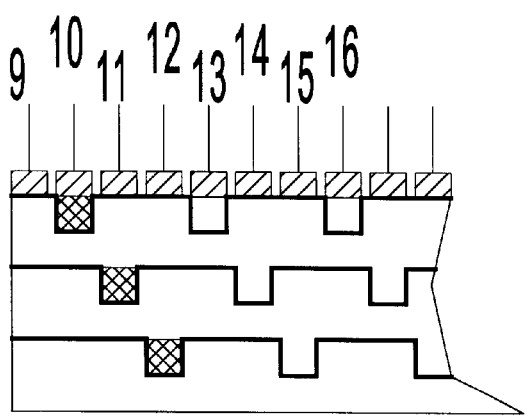

FIG. 2a illustrates the prior art physical representation of an N-channel CCD device and FIG. 2b schematically shows three-phase charge transfer. The CCD structure shown is typical of fabrication using the aluminium-gate silicon MOS transistor process, the basic fabrication steps of which are as follows: A relatively thick field oxide 7 (about I $\mu$m thick) is first grown on the surface of a lightly doped wafer of p-type silicon, although, as mentioned previously, an n-type substrate can be used. This field oxide is so thick that it is possible for conductors supplying the CCD electrodes, etc., to be deposited on it at a latter stage without the danger of creating spurious potential wells in the underlying silicon. Channel stop ion implantation (not shown in the figure) can be used to further eliminate spurious potential wells. Through windows etched in the field oxide n-type impurities are selectively introduced to form the charge input source 8, charge sense diffusion 17, and charge reset diffusion 19 for input/output features. Over the region of the charge transfer gate structure the field oxide is now removed and a thin (~0.1 $\mu$m) gate oxide 20 is grown. The metal aluminium is then evaporated over the slice and subsequently etched to form the required MOS electrodes and interconnection pattern.

FIG. 2a also shows a method for inputting charge to the CCD by the use a MOST (MOS Transistor) structure. By forward biasing source 8, input gate 9 controls charge allowed into the first $\emptyset_1$ electrode 10, which essentially acts as the drain of the input MOST. Thus a charge packet can be introduced to begin the charge transfer process and the recurring cycle time T by pulsing the input gate beyond threshold at the appropriate point in the CCD electrode clocking cycle. The input diffusion 8 supplies the minority carriers in the same way as does the source of an MOS transistor, indeed the input diffusion, input gate, and first 01 well act in a very similar manner to an MOST, the only difference being that the drain of a conventional MOST is replaced by a deep potential well. The amount of charge allowed to flow into the first $\emptyset_1$ well is controlled by the potentials on the input diffusion (usually somewhat reversed biased) and on the time the gate is on. There are a number of state-of-the-art charge input schemes including 'dynamic current injection', 'surface potential setting', 'diode cut off', 'potential equilibrium', 'fill and spill', 'supply charge isolation', 'phase referred inputting', and other methods.

The three sets of transfer electrodes 10, 11, 12, 13, 14, 15, 16, etc, for a 3$\emptyset$ CCD are shown interconnected whereby every third electrode is connected to the $\emptyset_1$, $\emptyset_2$, $\emptyset_3$ supply lines. Square wave pulses are preferably applied to these lines. If p-type silicon is used then a positive voltage applied to any electrode in the series will repel majority carriers to form a depletion layer under all the electrodes of that phase. Thus if a charge packet of electrons is introduced to the first $\emptyset_1$ electrode by the input MOST this charge packet of electrons can be transferred by assuring that sufficient positive voltage is applied to the adjacent electrode next to the charge packet. A charge packet can be transferred electrode-to-electrode in the 'forward' (i.e., left to right) direction. Traditionally, one set of electrodes, the $\emptyset_3$ electrodes in this example, are called 'rest' electrodes, while the $Ø_1$ and $Ø_2$ electrodes are called 'transfer' electrodes.

Referring now to FIG. 2b there is shown the clock timing diagram for three-phase transfer. The horizontal axis is time; the vertical axis is the amplitude of the signal applied to the phases. The high level corresponds to the maximum bias of an electrode. The clocks of the different phases cross at intermediary levels to improve the flow of charges from one electrode to another.

Assume a charge packet injected from the input gate and present under electrodes 10. Electrode 10, connected to the $Ø_1$ line, has a deeper depletion well than adjacent electrode 11 (connected to $Ø_2$ line, clocked "low") and also electrode 12 (connected to $Ø_3$ line, clocked "low"). Subsequently, if all the electrodes attached to the Ø2 line are biased strongly positive (clocked "high") while at the same time all the electrodes of Ø1 are debiased (clocked "low") charge then flows from under electrode 10 connected to the Ø1 clock to the 11 electrode connected to the Ø2 clock. The same operation is then reproduced by application of increased positive voltage applied to the $Ø_3$ lines while the $Ø_2$ electrodes are clocked low. This transfers charge from electrode 10 to electrode 12. Further charge packet transfers are by the same mechanism.

In addition to techniques for charge inputting it is necessary to detect charge position at the end of the cycle time T. Assume charge resides under electrode 15 the last electrode of the $Ø_3$ series. By the addition of output diode 17, or 'sense' diffusion, to the CCD register and by strongly reverse biasing this diffusion, it acts as a sink for any charges arriving. In principle, the last electrode would be the last Ø3 electrode, electrode 15 of FIG. 2a; in practice, however, an additional electrode, the output gate 16, is usually added. The output gate is usually held at a fixed bias beyond threshold, but much less positive than the sense diffusion and serves to minimize the electrostatic pick-up by the sense diffusion of the clock pulses on the last $Ø_3$ electrode. The simplest form of low-capacitance charge detection at the end of the transfer process is an on-chip MOST amplifier the gate 16 of which is connected directly to the sense diffusion. In this case a technique must be incorporated in the output circuitry for resetting the potential of the sense diffusion after the arrival of each charge packet. This is usually achieved by adding a reset diffusion 19 and a reset gate 18 as shown. The reset diffusion is kept at the most positive potential of all and the reset gate is pulsed momentarily after each charge packet has been detected. This absorbs the charge packet and resets the potential of the sense diffusion ready for the detection of the next charge packet. There are numerous state-of-the-art methods for charge detection including 'current output sensing', 'floating diffusion sensing', 'floating-gate sensing', and others. Apart from the input and sensing regions, there are no diffusions within the main CCD shift register.

Figure 3:
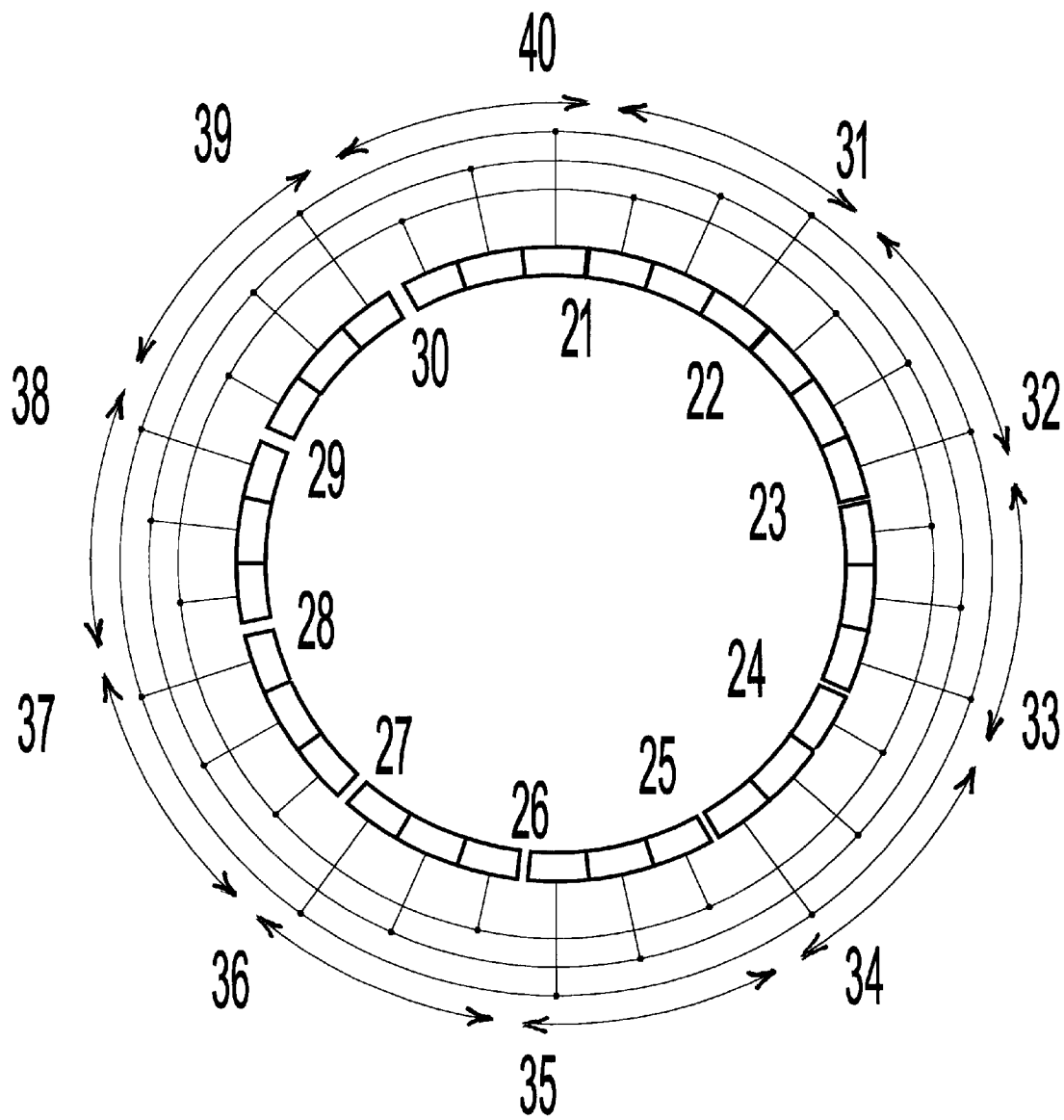
FIG. 3 illustrates a main feature of the present invention. Electrode spacing is chosen to better visually illustrate the incremental charge packet transfers.

FIG. 3 schematically illustrates the essential features of the present invention wherein the voltage required for charge transfer stage-to-stage changes in discrete amounts and incrementally. Electrode spacing is chosen to better visually illustrate the incremental charge packet transfers but those skilled in the art will recognize that other parameters can be used to control charge packet transfer. In this embodiment incremental voltage requirements for successive charge transfer stages is accomplished by controlled spacings between the $Ø_3$ rest electrodes and the next clockwise $Ø_1$ electrode at 21, 22, 23, 24, 25, 26, 27, 28, 29, 30. The $Ø_3$ rest electrodes are numbered 31, 32, 33, 34, 35, 36, 37, 38, 39, and 40 for the 10-state device described. The spacings are set so as to require discrete numerical transfer increments. In the present case assume 1 volt increments for successive stages of the device. Charge transfer from the $Ø_1$ electrodes to the succeeding $Ø_2$ electrode is set to require only 0.5 volts. Similarly, charge transfer from the $Ø_3$ electrodes to the $Ø_1$ electrodes is set to require only 0.5 volts.

Now assume application of an analog waveform of signal amplitude 3 V to all the electrodes in common using the phase timing sequence previously described. If the charge packet initially obtains under rest electrode 31, then a transfer voltage of 1 volt is required by electrode spacing 22 to transfer a charge packet from rest electrode 31 to the next clockwise associated $Ø_1$ electrode. Since 3 volts is applied the transfer can take place. Only 0.5 volts is required to transfer charge to the next clockwise associated $Ø_1$ electrode whereas 3 volts is available. Similarly for the next transfer to the $Ø_2$ electrode 2 volts is required to transfer. To transfer to the next rest electrode 32, as set by electrode spacing 22, since 3 volts is available transfer takes place. Subsequently the charge will transfer to the following $Ø_1$ and $Ø_2$ electrodes and also onto rest electrode 33 because 3 volts is required for transfer by gap spacing 22 and 3 volts is applied. Similarly, the following $Ø_2$ and $Ø_3$ electrodes can be traversed, however, the charge cannot transfer to electrode 34 because 4 volts is required for transfer and only 3 volts is available. By the method described the charge packet can be transferred up to electrode 33 and it will "rest" there until completion of the recurring cycle time T, to begin a new cycle. Consequently, a waveform of amplitude 3 volts has been identified by the position of the charge packet.

PREFERRED EMBODIMENTS OF THE INVENTION

Figure 4:
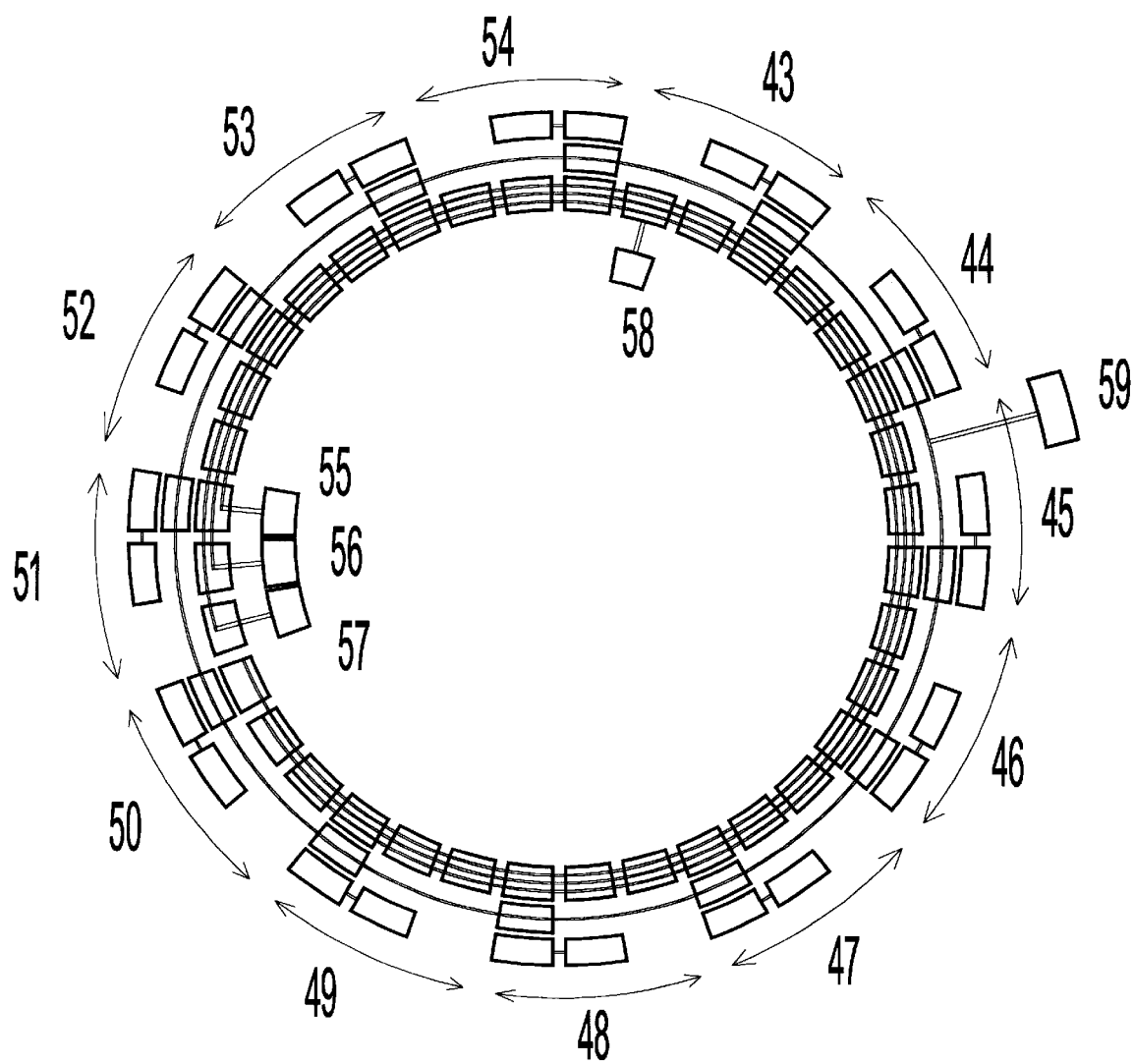
FIG. 4 illustrates an embodiment of the present invention whereby incremental charge transfer voltage is controlled by ion implantation.

Referring now to FIG. 4 there is shown an embodiment for a recurring three phase 12-state CCD. Electrode groups 43, 44, 45, 46, 47, 48, 49, 50, 51, 52, 53 and 54 are charge transfer stages each including a $Ø_1$ electrode, a $Ø_2$ electrode, a $Ø_3$ 'rest' electrode, plus, in common, charge detection gate 59, with associated charge detection diodes each transfer stage. Each charge transfer stage of the recurring device is set by selected distance of the $Ø_3$ 'rest' electrode from the succeeding (i.e., clockwise) $Ø_1$ electrode by increasingly higher charge transfer voltage requirement as described previously. In this 12-state CCD configuration ion implantation incrementally applied between successive $Ø_3$ 'rest' electrode and succeeding 01 electrode determines the positive voltage required for charge packet transfer thus allowing the charge packet to "rest" allowing pulsing of charge detection gate 59 at conclusion of the total recurring cycle time T to transfer charge to the diode thus signaling which output stage was activated.

In sequence, each charge transfer group, consisting of the three transfer electrodes, is set to require increasing incremental positive voltage by controlling selected depletion layer spreading of selected electrodes so as to control precise required transfer voltage for charge transfer to the next charge transfer stage. The clocking pulses are as previously described except that the analog signal to be sampled is applied to the $Ø_1$ electrodes, or preferably, all electrodes in common.

In the multi-state CCD system disclosed, control of how far the charge packet can be stepped 'rest'-electrode to 'rest'-electrode at application of an information bearing signal is by physical spacing of electrodes or by ion implantation between or under selected electrodes as described above. The illustrations show means for attaining higher order radix number than two system architecture, of base 10 or base 12 multi-states, but base radix number system detection system can be configured by the controllable accuracy of CCD gate transfer device parameters setting transfer voltage.

By properly chosen electrode spacing charge transfer can be set to require progressively increased transfer voltage each CCD stage from 1 volt to 10 volts in 1 volt increments. Thus during a single cycle time T, an analog signal at a magnitude 6 volts would allow transfer to the sixth transfer electrode and only the sixth transfer electrode during the recurring cycle time T. Further pulses at the same voltage amplitude are not high enough to bring about charge transfer to the next stage of the CCD. Consequently, the charge packet "rests" in that position during the cycle time T. Thereby a charge packet has been transferred to correspond to amplitude 6 volts. At the end of the cycle time T. an auxiliary line 59, which is a common charge detection gate, is pulsed allowing the "resting" charge packet to 'dump' (i.e., gate) from whatever 'rest' electrode respectively attained. In the case of the 6-volt amplitude applied, at the end of the cycle time T the charge will 'rest' at the position corresponding to the 6 volt stage of the CCD. By applying a gating pulse in synchronism with the ending of the recurring cycle time T, the associated charge at rest electrode 6 will be transferred to its associated charge detection diode. Detection of the charge by this output diode signals that a 6-volt signal strength obtained on the applied waveform.

In summary, the novel device has detected a waveform of six volt amplitude by means of a charge packet 'stepped' to the six volt stage of the incremental CCD where the charge packet 'rested' until completion of the recurring cycle time T. At the end of the cycle time T the charge packet is gated to an associated diode by a gate electrode. In consequence an applied voltage of amplitude of 6 volts has been detected at the CCD stage corresponding to the 6 volt waveform amplitude. It will be understood that the device does not have to be physically recurring and could be electronically recurring, such as by synchronizing completion of the pulse time T to initiate the beginning of charge injection for a new recurring time T.

Figure 5:
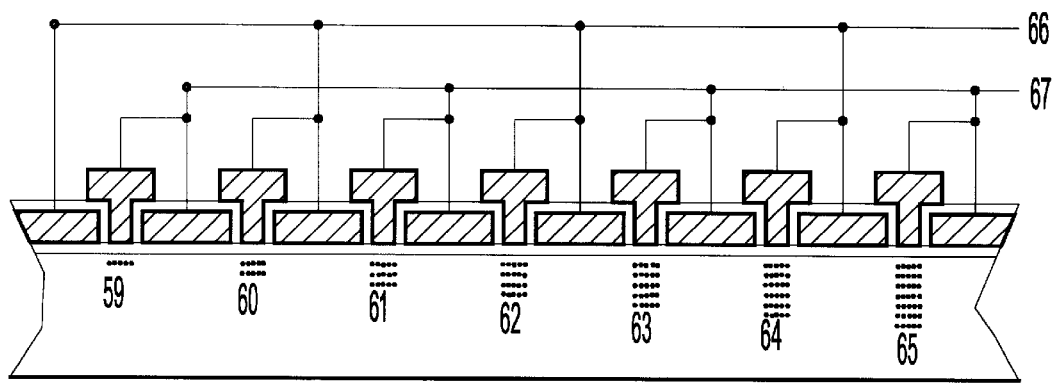
FIG. 5 illustrates a detail of an embodiment of the present invention whereby incremental charge transfer is controlled by ion implantation.

FIG. 5 shows a detail of another embodiment, a two-stage incremental CCD wherein the incremental transfer voltage is set by ion implementation. One of the major problems in early CCD structures was reliable fabrication of the inter-electrode gaps. For lightly-doped substrate material ($\sim 10^{15}$ dopant atoms/cm$^3$) and clock voltages of about 10 V. the depletion layer beneath the oxide extends into the semiconductor about I to 4 $\mu$m, depending on the amount of charge in the inversion layer. Since a depletion layer extends laterally beyond the overlying electrode by about as much as it extends into the bulk semiconductor, it follows that the inter-electrode gaps must be of the same order as the desired depletion width, otherwise charge will have difficulty in flowing between adjacent potential wells. Too large an inter-electrode gap creates a potential barrier between adjacent wells which inhibits charge transfer. Because of the difficulties in making inter-electrode gaps of the order of 1 through 4 $\mu$ms, in aluminium-gate technology, this procedure has been superseded by silicon-gate technology which allows much more accurate interelectrode spacing. When this state-of-the-art technology is combined with ion implantation methods even better control of incremental transfer voltage can be achieved.

In the FIG. 5 embodiment, the required incremental transfer voltage is set by forming precision doped regions between the transfer stages using ion implantation, This method is particularly simple and wholly compatible with the technology usually employed in the fabrication of MOS structures. Charge control in the gate dielectric is one way to accomplish the desired threshold control but it is much more difficult to stabilize than is dopant density in the semiconductor between/beneath the electrodes. Therefore, dopant density in the semiconductor portion of the MOS structure allows the best threshold voltage control. The embodiment shown as FIG. 5 shows incremental transfer stages set by ion implantation in selected electrode gaps. The particular method of achieving a CCD clocked with only two input phase lines will not be described because it is well known in the art.

In the embodiment shown in FIG. 5 precise incremental transfer of charge, each transfer stage, is controlled by precision ion implantation between stages. Transfer groups 59, 60, 61, 62, 63, 64, 65, for example, are clocked using the lines 66 and 67. At the first incremental charge state position a potential barrier is set up by ion implantation to correspond to '1'. At the second incremental charge transfer position a second implant sets a potential barrier corresponding to '2', and so on, incrementally until a total number of incremental states are established setting the mathematical radix for the device. Required charge input and charge detection is by methods previously described. The radix order of the system is set therefore by the precision of control of incremental ion implantation processing.

Other methods of controlling the voltage required for selective charge transfer are well known in the art. For example, direct application of applied voltage to a gate between electrodes could be used to control the threshold voltage to determine charge packet transfer. This method can be used directly or by "trimming" the required charge transfer voltage to meet the particular charge transfer voltage desired. By this method rather than linear representation of an applied waveform the transformation of an applied signal could be accomplished. By the method of applied gate voltage it would, in fact, be possible to apply changing required charge transfer voltage to successive transfer stages thereby achieving encription of an applied waveform.

Figure 6:
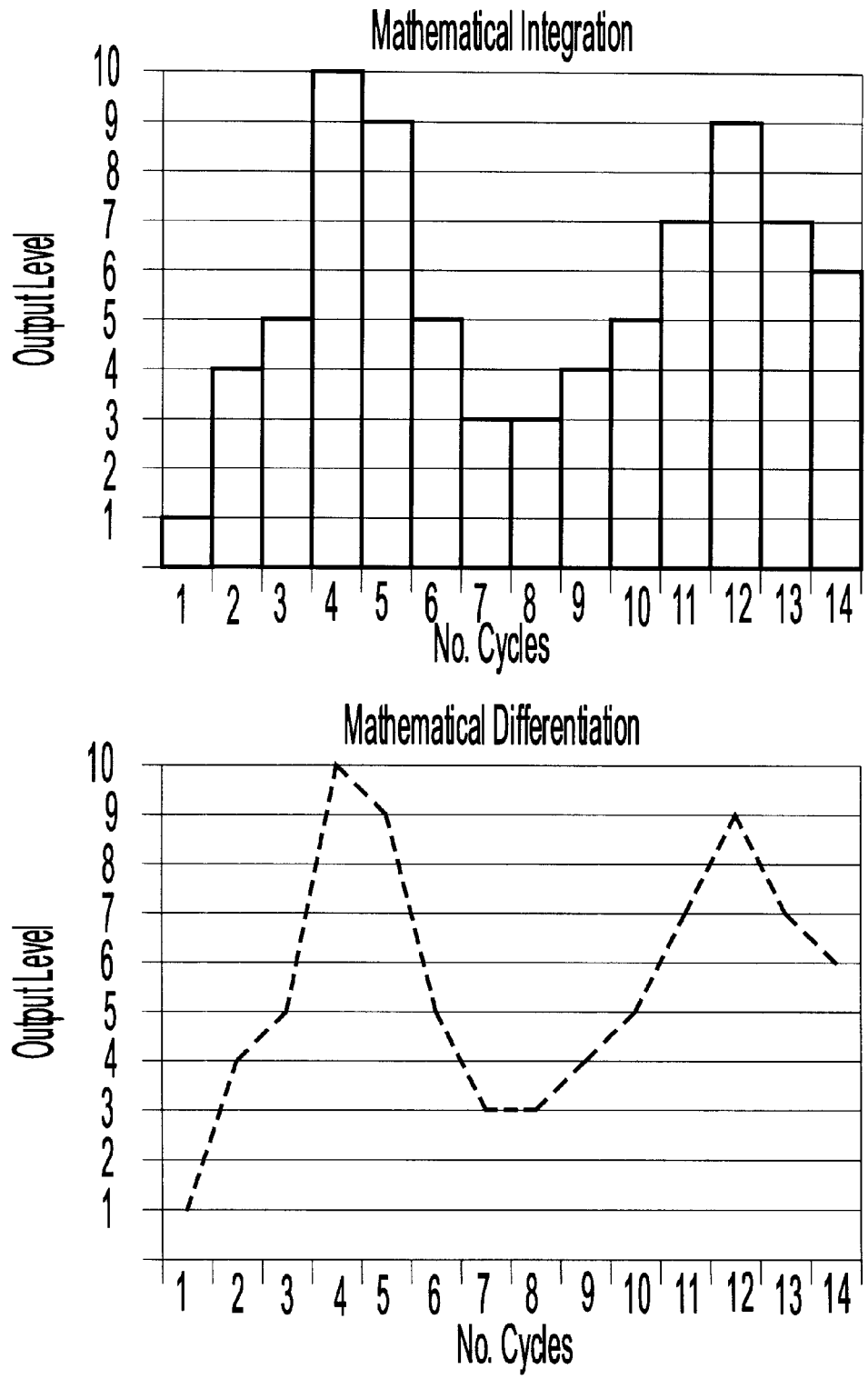
FIG. 6 shows schematically the processes of waveform amplitude detection combined with recurring cycle timing to allow integration and differentiation of the waveform.

FIG. 6 shows schematically the processes of waveform amplitude detection combined with recurring cycle timing which allows integration and differentiation of the waveform. It will be understood that the charge detection output will have to be electronically modified to correspond with the detected charge packet. For example, a charge packet detected at the corresponding #6 stage of the device must be accorded a weight of 6 compared to the other respective outputs. This could be done, for example, by providing an amplified output 6 times the magnitude of the #1 stage. All the other outputs must be similarly weighted.

By the innovative procedure it becomes easy to output integration and differentiation of the waveform. FIG. (6) shows how integration can be obtained from the 10-state device. For integration, this procedure is mathematically described by Riemann Summing. The sum of the rectangles, wherein the 'mesh' (i.e., cycle time) approaches zero will sum to the integral limit which has the area under the waveform curve during the integration period. As the cycle sampling period T becomes faster the output waveform approaches the waveform integral as a limit by summation of the output values. Similarly, FIG. 6 shows how differentiation of the analog waveform is accomplished by dividing the successive differences of output values by the cycle period T to achieve a simple, accurate differentiation of the waveform. Successive differences of the output waveforms from the multistate device allows higher order differentiation of analog waveforms. Consequently, simple addition and subtraction, during the recurring time period T, allows first order differentiation and integration of waveforms by the novel device.

There are therefore four timing cycles of consideration; (1) the clocking time which is the charge transfer timing for charge transfer each electrode, (2) the transfer stage time, which is the time each increment, (3) the recurring cycle time T, which is the time to repeat the radix number, and (4) the integration and/or differentiation period. FIG. 6 schematically shows both the cycle time amplitude detected at each recurring cycle time T and the integration-differentiation period.

It will be understood that while the invention shown provides discrete output in accord with sampled waveform amplitude it is not continuous and while this phenomena is not important for most applications, and while such period may be very short if the recurring cycle time is short, it is sometimes desirable to remove sharp transients from the output voltage. This may be done by providing a high pass filter in the output circuit.

The invention is applicable to both Surface Channel (SCCD) and Bulk, or Buried Channel (BCCD) devices. The use of 1Ø, 2Ø, 3Ø, or 4Ø clocking is included. Whether the incremental voltage steps are formed by undercutting, oxide steps, oblique, evaporation, castellated oxide, implanted barriers, or other state of the art integrated circuit processes, these are encompassed by the disclosure herein. It will also be apparent to those skilled in the art that the invention is as well applicable to numerical systems of radix other than "ten". A higher radix number system than decimal architecture, for example a base 16 hexadecimal system, or any other could be implemented, limited by the practical requirement of achieving precision incremental charge transfer control in a 2-Ø, 3-Ø, CCD, or other charge transfer device.

While the invention shown provides an output having a magnitude directly proportional to an applied voltage magnitude, it will be apparent that the transfer stage settings could enable outputs commensurate with any function other than linear.

Those skilled in the art will readily perceive that the component values shown are exemplary only and that numerous alterations may be made without departing from the scope of the claims.

While the invention has been described in preferred embodiments, it is to be understood that the words which have been used are words of description rather than limitation and that changes within the purview of the appended claims may be made without departing from the true scope of the invention as defined by the claims.

What is claimed:

1. An analog-to-digital converter comprising:
   (a) a plurality, n in base radix number, of CCD comparator structures, with
   (b) clock signals generating means for consecutively numbered cycles from a reference time, and
   (c) fixed means of gating successive charge transfer stages by increasing potential barrier in cardinal increments ordinally numbered first through $n^{th}$;
   (f) charge packet injection means for supplying initiating charge packet to the lowest cardinal value transfer stage each recurring n-stage cycle time, and
   (g) charge detection means each rest electrode, whereby
   respective means of applying information bearing signal to said gated charge transfer stages provides charge packet detection of the information bearing signal at completion of said n-stage cycle time in correspondence with said information bearing signal voltage.

2. An analog-to-digital converter as set forth in claim 1 having:
   variable means of gating successive charge transfer potential barrier stages by increasing selected voltage increments applied to transfer electrode gates, whereby
   respective means of applying information bearing signal to transfer electrodes allows correspondence of said signal with said variably applied charge transfer gating.

3. An analog-to-digital converter as set forth in claim 1 having:
   linearly increasing potential barrier gating of successive charge transfer stages of cardinal increments ordinally numbered first through $n^{th}$, whereby
   respective means of applying information bearing signal to transfer electrodes allows linear correspondence of said signal with said applied linear charge transfer gating.

4. An analog-to-digital converter as set forth in claim 1 having:
   nonlinear increasing potential barrier gating of successive charge transfer stages ordinally numbered first through $n^{th}$, whereby
   respective means of applying information bearing signal to charge transfer stages allows offsetting of said signal in correspondence with said applied nonlinear charge transfer gating.

5. An analog-to-digital converter as set forth in claim 1 having:
   sequentially sampled output voltage level magnitude summing means over a desired interval, whereby
   said summing means results in mathematical integration of the information bearing signal.

6. An analog-to-digital converter as set forth in claim 1 having:
   sequentially sampled output voltage level difference divided by n-stage cycle time means, whereby
   said output voltage level difference divided by nstage cycle time results in mathematical differentiation of the information bearing signal.

* * * * *